United States Patent
Lu

(10) Patent No.: US 6,177,357 B1
(45) Date of Patent: Jan. 23, 2001

(54) METHOD FOR MAKING FLEXIBLE CIRCUITS

(75) Inventor: David D. Lu, Austin, TX (US)

(73) Assignee: 3M Innovative Properties Company, St. Paul, MN (US)

(*) Notice: Under 35 U.S.C. 154(b), the term of this patent shall be extended for 0 days.

(21) Appl. No.: 09/303,168

(22) Filed: Apr. 30, 1999

(51) Int. Cl.$^7$ .............................. H01L 27/00; H05K 1/09; B44C 1/22
(52) U.S. Cl. .................... 438/745; 438/106; 438/783; 438/780; 438/784; 438/781
(58) Field of Search ................... 438/745, 106, 438/783, 780, 781, 784; 528/353, 128; 522/15, 18; 428/209

(56) References Cited

U.S. PATENT DOCUMENTS

| 3,395,057 | 7/1968 | Fick et al. ................................ 156/3 |
| 3,871,930 | 3/1975 | Fish ........................................... 156/3 |
| 4,039,371 | 8/1977 | Brunner et al. ....................... 156/668 |
| 4,857,143 | 8/1989 | Glenning et al. ..................... 156/668 |
| 5,227,008 | * 7/1993 | Klun et al. ........................... 428/209 |
| 5,393,864 | * 2/1995 | Summers .............................. 528/353 |
| 5,493,074 | * 2/1996 | Murata et al. ....................... 174/254 |
| 5,776,995 | * 7/1998 | Obiya et al. ........................... 522/15 |

FOREIGN PATENT DOCUMENTS 0 394 638 A2 * 10/1990 (EP) ........................... H01L/21/311

* cited by examiner

Primary Examiner—Matthew Smith
Assistant Examiner—Igwe U. Anya
(74) Attorney, Agent, or Firm—Darla P. Fonseca

(57) ABSTRACT

A process for making flexible circuits wherein the etching of a polymeric film is accomplished by dissolving portions thereof with concentrated aqueous base using a UV-curable 100% active liquid photoresist as a mask, comprising the steps of laminating the resist on a polymeric film, exposing a pattern into the resist, developing the resist with a dilute aqueous solution until desired image is obtained, etching portions of the polymeric film not covered by the crosslinked resist with a concentrated base at a temperature of from about 50° C. to about 120° C., and then stripping the resist off the polymeric film.

3 Claims, No Drawings

METHOD FOR MAKING FLEXIBLE CIRCUITS

BACKGROUND OF THE INVENTION

1. Field of the Invention

The invention provides a process for making flexible circuits comprising the step of etching polymer films by masking portions thereof with UV curable 100% active liquid photoresist and dissolving unmasked portions thereof with concentrated aqueous base. The crosslinked photoresist is then removed by mild base solution.

2. Description of the Related Art

A typical step in the fabrication of electronic circuitry on polymeric carrier films is to etch through the polymeric film to allow for subsequent connection through the backside to other devices or, where applicable, connection of frontside and backside circuitry. The selective etching or milling is necessary to allow electrical connections to be made between the differing conductive layers. Those portions of the polymeric film for which etching is not desired must be masked with a protective coating. The masking process can be satisfactorily done with the art of photolithography whereby an etch-insensitive material is applied and patterned using normal lithographic methods, i.e., exposure and development.

Solvent processible, water-insoluble or water-insensitive photoresists are ideal for masking where the subsequent etching process is aqueous based. Solvent processible resists are both developed and stripped using solvents and remain intact during such a process and thus protect any covered areas of the polymeric film while allowing etching of areas not protected by resists. However, solvent processible resists are less desirable from environmental and economic perspectives, and thus aqueous processible resists are preferred.

However, aqueous processible resists are stripped using dilute bases. Therefore, they have not been used as masks in processes involving aqueous base chemical etching of polymers.

U.S. Pat. No. 4,039,371 discloses a composition for etching polyimide based polymers comprising a tetraalkyl ammonium hydroxide and acetic acid, tartaric acid or oxalic acid. The resists disclosed to be useful as masks are positive resists; those resists specifically mentioned are all solvent processible and coated by spin-coating techniques.

U.S. Pat. No. 3,871,930 discloses the use of a commercial solvent processible photomask for use with an etching solution comprising a suitable base in a nonaqueous solvent such as dimethylsulfoxide.

U.S. Pat. No. 3,395,057 discloses the use of solvent processible photoresists and copper foils to mask those areas not to be etched.

U.S. Pat. No. 4,857,143 discloses a process for etching a fully or substantially fully cured polyimide layer which comprises contacting such layer with an aqueous solution at least about 3 molar of a metal hydroxide and at least about 0.5 molar of a metal carbonate, metal sulfate or metal phosphate. It is specifically disclosed that copper is used as the etching mask for the polyimide film.

It has now been discovered that the etching step may be done with hot, concentrated, e.g., 35% potassium hydroxide, using a crosslinked UV-curable 100% active liquid processible photoresist as a mask. The photoresist protects the masked area such that etching of the polymer film is completed only where desired without significantly swelling or delaminating the photoresist. This process avoids use of a solvent processible resist, while also eliminating processing steps and the need for copper masks.

SUMMARY OF THE INVENTION

The invention provides a process for etching a fully cured or substantially fully cured polymeric film which comprises contacting said polymeric film with a concentrated base at a temperature of from about 50° C. to about 120° C., wherein portions of said polymeric film are protected with a mask comprising a UV-curable 100% active liquid photoresist, the photoresist exhibiting substantially no swelling or delamination from said polymeric film during the etching.

The invention further provides a process for making flexible circuits wherein the step of etching of a polymeric film is accomplished by dissolving portions thereof, using a UV-curable 100% active liquid photoresist as an etching mask, comprising the steps of a) aminating said photoresist on a polymeric film, b) xposing at least a portion of said photoresist, thereby crosslinking said exposed portions thereof, c) developing said photoresist with a dilute aqueous solution until desired image is obtained, d) etching portions of the polymeric film not covered by the crosslinked photoresist with a concentrated base at a temperature of from about 50° C. to about 120° C., e) stripping said crosslinked photoresist off said polymeric film with a dilute aqueous basic solution.

The invention also provides a preferred process wherein the concentrated aqueous base used to etch the polymeric film is 35% or stronger potassium hydroxide.

As used herein the terms "resist" and "photoresist" are synonymous and interchangeable. Also, the terms "pattern" and "image" are used interchangeably to mean the configuration which is formed by the exposure and development of a photoresist.

DETAILED DESCRIPTION OF THE INVENTION

The processes of the present invention are concerned with the etching of substantially fully cured polymeric films, including such films as polyester, e.g., poly(ethylene terephthalate), polycarbonates, and polyimide. Polyimides are preferred polymeric films, including unmodified polyimides as well as modified polyimides such as polyester imides, polyimide-imide-esters, polyamide-imides, polysiloxane-imides, and other mixed imides. Especially preferred is a polyimide polymer made from the anhydride of pyromellitic acid and 4,4 diamino-diphenyl ether represented by the general formula:

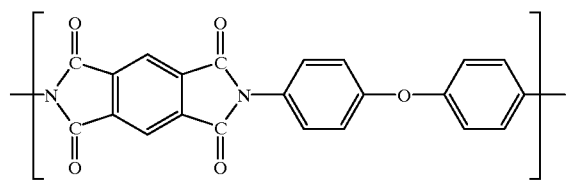

wherein n ranges from about 150 to about 650, available from E.I. DuPont de Nemours and Company, (DuPont), under the tradename Kapton™, e.g., Kapton™ V, Kapton™ E and Kapton™ H, and also available from Kaneka Chemical Industries under the trade name Apical™. Other commercially available polyimide precursors include those available from DuPont under the trade name Pyralin™.

The UV-curable liquid photoresists useful in processes of the invention include one or more ethylenically unsaturated, photopolymerizable, low molecular weight compound, one or more addition-polymerizable monomers, and one or more initiators.

Such photoresists typically consist of one or more α, β-unsaturated carboxyl-containing acrylates or methacrylates. Examples of monomers used in such photoresists include cinnamic acid, crotonic acid, sorbic acid, acrylic acid, methacrylic acid, itaconic acid, propionic acid, maleic acid, fumaric acid and half-esters and anhydrides of such acids, and the like. Such monomers are typically present in an amount of from about 10% to about 60%, based on the total composition.

Also typically included in such photoresists is at least one addition polymerizable noncarboxyl-containing monomers. Typical monomers include alklylene or polyalkylene glycol diacrylates; glycerol triacrylate; 1,3-propandiol di(meth) acrylate; 1,2,4-butanetriol trimethacrylate; 1,4-benzenediol di(meth)acrylate; 1,3-cyclohexanediol diacrylate; pentaerythritol tri- and tetra-(meth)acrylates; tetraethylene glycol dimethacrylate, trimethylolpropane methacrylate; triethylene glycol diacrylate; tetraethylene glycol diacrylate; 1,6-hexanediol diacrylate, 1,5-pentanediol dimethacrylate, and the bis-(meth)acrylates of polyethylene glycols, polypropylene glycols, bisphenol epoxy, and copolymers thereof having molecular weights of from about 100 to about 750. Such monomers are typically present in an amount of from about 35% to about 85%.

The free-radical photoinitiator useful with the liquid photoresist is a one activatable by actinic radiation. Examples include aromatic ketones such as benzophenone, and dimethoxyphenyl acetophenone, Michler's ketone, 4,4'-bis (diethylamino)benzophenone, 2-ethylanthroquinone, thioxanthones, benzoin alkyl ethers and benzyl ketals. Useful photoinitiators are discussed in U.S. Pat. No. 4,268,619, the disclosure of which is incorporated herein by reference.

Useful etchants are concentrated bases which are water soluble including, but not limited to, potassium hydroxide, sodium hydroxide, and cesium hydroxide. Bases with low water solubility such as lithium hydroxide, aluminum hydroxide, and calcium hydroxide are not useful in processes of the invention as the solution becomes saturated prior to reaching useful concentrations.

The useful concentration of the etchant varies with the specific selection thereof, the thickness of the polymeric film to be etched, as well as the type and thickness of the photoresist chosen. Typical useful concentrations range from about 25% to about 60% by weight, preferably from about 35% to about 50%. In one highly preferred embodiment, potassium hydroxide having a concentration of from about 39% to about 45% is used. In an alternative embodiment, sodium hydroxide is used at a concentration of from about 25% to about 60% by weight.

The etching step of the process of the present invention is accomplished by contacting unmasked areas of the polymeric film with the concentrated base etchant.

The time for etching depends upon the type and thickness of the film to be etched and is typically from about 10 seconds to about 20 minutes. When the preferred etchant, concentrated KOH, is used, the etching time for a 50 micrometer (2 mil) polyimide film is from about 30 seconds to about 180 seconds. The etching solution is generally at a temperature of from about 50° C. (122° F.) to about 120° C. (250° F.).

The process of making flexible circuits according to the invention comprises the step of etching which may be used in conjunction with various known pre-etching and post-etching procedures. The sequence of such procedures may be varied as desired for the particular application.

A typical sequence of steps may be described as follows:
The UV-curable photoresists are laminated onto both sides of a substrate having a polymeric film side and a copper side, using standard laminating techniques and then cured under UV light to form a protective mask for the exposed polyimide substrate. Typically, the substrate consists of a polymeric film layer of from about 25 micrometers to about 125 micrometers, with the copper layer being from about 1 to about 5 micrometers thick. The substrate may be made by various methods such as adhesively bonding a polyimide layer onto copper foil, coating liquid polyimide on copper foil or the like.

The thickness of the photoresist is from about 25 to about 50 micrometers. The photoresist is then exposed on both sides to ultraviolet light or the like, through a mask, crosslinking the exposed portions of the 100% active liquid resist. The copper side of the laminate is then further plated to desired thickness. The laminate is then placed into a bath of concentrated base at a temperature of from about 50° C. to about 120° C. which etches the portions of the polymeric film not covered by the crosslinked resist. This exposes certain areas of the original thin copper layer. The resist is then stripped off both sides of the laminate in a 2–5% solution of an alkaline metal hydroxide at from about 20° C. to about 80° C., preferably from about 20° C. to about 60° C. Subsequently, the original thin copper layer is etched where exposed with an etchant which does not harm the polymeric film, e.g., Perma-etch™, available from Electrochemicals, Inc.

In an alternate process, the UV-curable 100% active liquid photoresists are laminated onto both sides of a substrate having a polymeric film side and a copper side, using standard laminating techniques. The substrate consists of a polymeric film layer about 12 micrometers to about 125 micrometers thick with the copper layer being from about 12 to about 40 micrometers thick. The photoresist is then exposed on both sides to ultraviolet light or the like, through a suitable mask, crosslinking the exposed portions of the resist. The copper layer is then etched to obtain circuitry, and portions of the polymeric layer thus exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the concentrated base at a temperature of from about 70° C. to about 120° C., and the photoresists are then stripped from both sides with a dilute basic solution.

Other steps may also be included, such as soaking the film in hot water before or after the etching bath. Acid baths may also be used as a post-etching neutralization.

To create finished products such as flexible circuits, interconnect bonding tape for "TAB" (tape automated bonding) processes, microflex circuits, and the like, further layers may be added and processed, the copper plating may be plated with gold, tin, or nickel for subsequent soldering procedures and the like according to conventional means.

The following examples are meant to be illustrative and are not intended to limit the scope of the invention which is expressed solely by the claims.

EXAMPLES

Example 1

Two layers of 50 micron thick aqueous resists, available from DuPont under the tradename Riston™ 4720, were laminated with heated rubber rolls to a flexible substrate consisting of 50 microns of Kapton™ H polyimide on one side and copper on the other. The laminate was then exposed with ultraviolet (UV) light through a phototool on each side and developed with 0.75% aqueous solution of sodium carbonate on both sides to obtain desired image of circuitry. Copper was then plated on the copper side of the laminate to 35 microns in thickness. The copper side was then coated with liquid photoresist and cured with ultraviolet radiation. The polyimide side was then etched in a conveyorized machine having a KOH module with 4 spray bars with flat jet nozzles using 43% to 47% KOH at 75° C. to 95° C. for about 3 to 7 minutes. There was no significant swelling of the resist mask nor any stripping of the resist from the polyimide surface.

The resists on both sides were then stripped from the laminate with 3–4% KOH for 1 to 2 minutes at 60° C. The resists swelled and delaminated from the copper and polyimide surfaces cleanly. The circuitry was then produced by etching the initial copper layer with Perma-Etch™, available from Electrochemicals, Inc.

This is an improvement on dry film laminated process because the liquid photoresist coating process allows coating material to form a void free continuous film that eliminates the possibility of polyimide divot defects.

Example 2

A coating was prepared by mixing 33.5 parts of an epoxy acrylate, available commercially as Ebercryl™ 3701 with 7.0 parts of 1,6-hexanediol dimethacrylate, 55.3 parts of carboxylated acrylate monomer b-CEA and 3 parts of photoinitiator, Irgacure™ 1700 to form a homogeneous solution.

The mixture was then coated onto the copper side of a flexible circuit that is etched to form a circuit pattern by substractive process at a thickness of from about 25 micrometers to about 50 micrometers, and the coating is then cured under UV light to form a cured, or crosslinked, protective mask for the exposed polyimide substrate on the copper side. The protected flex circuit was then etched in a 43% to 47% concentrated KOH bath at 75° C. to 95° C. for about 3–6 minutes. There was no significant swelling of the resist mask nor any stripping of the resist from the polyimide surface.

The resist on both sides was then stripped off with 3–4% KOH for 1–2 minutes at 60° C. The resist cleanly delaminated from the copper and polyimide surfaces.

In another application, this coating is applied on the copper side of a flexible circuit that is prepared by an additive process with thin copper flash. The material was coated at a thickness of from about 35 micrometers to about 50 micrometers, and the UV-cured for form a protective mask, which protests the polyimide substrate that is exposed to concentrated KOH through pinholes on the thin copper flash.

The protective flex circuit was then etched in a 43% to 47% concentrated KOH bath at 75° C. to 95° C. for about 3–6 minutes. There was no significant swelling of the resist mask nor any stripping of the resist from the polyimide surface.

The resist on both sides was then stripped off with 3–4% KOH for 1–2 minutes at 60° C. The resist cleanly delaminated from the polyimide surface. In a similar test without the protective mask, the flexible circuits were observed to have lots of polyimide divot defects on the circuit side.

Example 3

A coating was prepared by mixing 24.5 parts of an ethoxylated epoxy acrylate, available commercially as Sartomer™ SR-348, 12 parts of an epoxy acrylate, available commercially as Ebercryl™ 3701, 48.5 parts of a carboxylated acrylate monomer b-CEA, and 3 parts of photoinitiator Irgacure™ 1700 to form a homogeneous solution.

The mixture was then coated onto the copper side of a flexible circuit that is etched to form a circuit pattern by substractive process at a thickness of from about 25 micrometers to about 50 micrometers, and the coating is then cured under UV light to form a cured, or crosslinked, protective mask for the exposed polyimide substrate on the copper side. The protected flex circuit was then etched in a 43% to 47% concentrated KOH bath at 75° C. to 95° C. for about 3–6 minutes. There was no significant swelling of the resist mask nor any stripping of the resist from the polyimide surface.

The resist on both sides was then stripped off with 3–4% KOH for 1–2 minutes at 60° C. The resist cleanly delaminated from the copper and polyimide surfaces.

Example 4

A coating was prepared by mixing 37.5 parts of a rubber modified epoxy acrylate, available commercially as Ebercryl™ 3604, 12.5 parts of 1,6-hexanediol dimethacrylate, 50 parts of a carboxylated acrylate monomer b-CEA, and 3 parts of photoinitiator Irgacure™ 1700 to form a homogeneous solution.

The mixture was then coated onto the copper side of a flexible circuit that is etched to form a circuit pattern by substractive process at a thickness of from about 25 micrometers to about 50 micrometers, and the coating is then cured under UV light to form a cured, or crosslinked, protective mask for the exposed polyimide substrate on the copper side. The protected flex circuit was then etched in a 43% to 47% concentrated KOH bath at 75° C. to 95° C. for about 3–6 minutes. There was no significant swelling of the resist mask nor any stripping of the resist from the polyimide surface.

The resist on both sides was then stripped off with 3–4% KOH for 1–2 minutes at 60° C. The resist cleanly delaminated from the copper and polyimide surfaces.

Example 5

A coating was prepared by mixing 40 parts of a epoxy acrylate, 8.5 parts of 1,6-hexanediol dimethacrylate, 48.5 parts of methacrylic acid, and 3 parts of photoinitiator Irgacure™ 1700 to form a homogeneous solution.

The mixture was then coated onto the copper side of a flexible circuit that is etched to form a circuit pattern by substractive process at a thickness of from about 25 micrometers to about 50 micrometers, and the coating is then cured under UV light to form a cured, or crosslinked, protective mask for the exposed polyimide substrate on the copper side. The protected flex circuit was then etched in a 43% to 47% concentrated KOH bath at 75° C. to 95° C. for about 3–6 minutes. There was no significant swelling of the resist mask nor any stripping of the resist from the polyimide surface.

The resist on both sides was then stripped off with 3–4% KOH for 1–2 minutes at 60° C. The resist cleanly delaminated from the copper and polyimide surfaces.

What is claimed is:

1. A process for making a flexible printed circuit wherein etching of a polymeric film is accomplished by dissolving portions thereof with concentrated aqueous base, using a UV-curable, 100% active liquid photoresist as a mask, comprising the steps of a) laminating said resist on a flexible substrate comprising a layer of polymeric film and a thin layer of copper, b) exposing at least a portion of said resist thereby crosslinking said exposed portions, c) plating circuitry atop said thin copper layer to desired thickness, d) etching portions of said polymeric film not covered by the crosslinked resist with a concentrated base at a temperature of from about 70° C. to about 120° C., e) stripping said resist off said polymeric film with dilute basic solution, and f) etching said thin copper layer to obtain circuitry.

2. A process according to claim 1 wherein said thin copper layer has a thickness of from about 1 micrometer to about 5 micrometers.

3. A circuit made by the process of claim 1.

* * * * *